(12) United States Patent
Chavez (10) Patent No.: US 11,378,645 B2
(45) Date of Patent: Jul. 5, 2022

(54) SYSTEM AND METHOD FOR BLIND DIFFERENTIAL TIME-OF-ARRIVAL ESTIMATION

(71) Applicant: Rockwell Collins, Inc., Cedar Rapids, IA (US)

(72) Inventor: Carlos J. Chavez, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 468 days.

(21) Appl. No.: 16/506,342

(22) Filed: Jul. 9, 2019

(65) Prior Publication Data

US 2021/0247480 A1 Aug. 12, 2021

(51) Int. Cl.
*G01S 5/06* (2006.01)
*G01S 5/02* (2010.01)
(Continued)

(52) U.S. Cl.
CPC ............ *G01S 5/06* (2013.01); *G01R 29/26* (2013.01); *G01S 5/0215* (2013.01); *G01S 5/02213* (2020.05); *H04B 3/462* (2013.01)

(58) Field of Classification Search
CPC ............ G01S 5/06; G01S 5/0081; G01S 5/0221–02216
See application file for complete search history.

(56) References Cited

U.S. PATENT DOCUMENTS 5,327,144 A * 7/1994 Stilp ................ H04W 64/00
342/387

7,239,876 B2 * 7/2007 Johnson ............... H04B 7/005
342/457
(Continued)

FOREIGN PATENT DOCUMENTS

EP 1014105 A2 6/2000
GB 2330716 A 4/1999

OTHER PUBLICATIONS

Chao Shen et al: "Parameter estimation of digital communication signal", 2014 IEEE Workshop on Advanced Research and Technology in Industry Applications (WARTIA), IEEE, Sep. 29, 2014 (Sep. 29, 2014), pp. 1080-1083, XP032697654, DOI: 10.1109/WARTIA. 2014.6976464 [retrieved on Dec. 4, 2014].

(Continued)

*Primary Examiner* — Cassi J Galt
(74) *Attorney, Agent, or Firm* — Suiter Swantz pc llo (57) ABSTRACT

A system for determining a geographical position of a transmitting device is disclosed. In embodiments, the system includes a concentrator device and a plurality of sensors. In embodiments, each sensor may be configured to: receive an emitter signal from a transmitting device; generate a demodulated sequence of the emitter signal; generate a time-of-arrival (TOA) estimate of the emitter signal; and transmit the demodulated sequence and the TOA estimate to the concentrator device. In embodiments, the concentrator may be configured to: receive a first demodulated sequence and a first TOA estimate ($TOA_1$) from a first sensor; receive a second demodulated sequence and a second TOA estimate ($TOA_2$), from a second sensor; determine a first arbitrary timing offset ($ATO_1$) between the first demodulated sequence and the second demodulated sequence; and determine a first differential TOA estimate ($TOA_{Diff_1}$) between the first sensor and the second sensor.

15 Claims, 5 Drawing Sheets

(51) Int. Cl.
 *G01R 29/26* (2006.01)
 *H04B 3/462* (2015.01)

(56) References Cited

U.S. PATENT DOCUMENTS

| | | | |
|---|---|---|---|
| 7,340,259 B2* | 3/2008 | Maloney | G01S 5/12 |
| | | | 455/456.1 |
| 10,775,510 B2* | 9/2020 | Agee | G01S 19/215 |
| 2014/0073352 A1 | 3/2014 | Aldana et al. | |
| 2015/0071092 A1 | 3/2015 | Mirbagheri et al. | |

OTHER PUBLICATIONS

Search Report for European Application No. 20185059.1 dated Nov. 12, 2020, 9 pages.

* cited by examiner

SYSTEM AND METHOD FOR BLIND DIFFERENTIAL TIME-OF-ARRIVAL ESTIMATION

BACKGROUND

Time-difference-of-arrival (TDOA) estimation is a conventional approach used for determining a geographical position of an emitter or transmitting device (e.g., radio frequency emitter). Conventional TDOA techniques involve receiving signals from a single transmitting device at two geographically separated sensors/receivers, and cross-correlating the signals in order to estimate the TDOA for one baseline between the two sensors/receivers. By processing multiple baselines (e.g., multiple TDOA estimates between pairs of sensors), the geographical position of the transmitting device may be estimated.

The conventional TDOA estimation approach requires high-resolution digitized sample-streams of the signals received by the sensors/receivers to be transmitted to a common device (e.g., concentrator device) in order for the common device to carry out the cross-correlation. This requires high-data-rate connectivity between the respective sensors/receivers and the common device (e.g., concentrator device). Transmitting these high-resolution digitized sample-streams may be easily accommodated with a hard-wired communication structure. However, non-hardwired communication structures, such as wireless networks, may be easily overwhelmed by the high-data-rate required. In this regard, conventional TDOA estimation approaches may be incompatible in the context of wireless communication networks. Therefore, it would be desirable to provide a system and method which cure one or more of the shortfalls of the previous approaches identified above.

SUMMARY

A system for determining a geographical position of a transmitting device is disclosed. In embodiments, the system includes a concentrator device and a plurality of sensors communicatively coupled to the concentrator device. In embodiments, each sensor includes a communication interface configured to receive an emitter signal from a transmitting device, and a controller communicatively coupled to the communication interface. The controller may be configured to: receive the emitter signal from the communication interface; demodulate the emitter signal to generate a demodulated sequence of the emitter signal; correlate the demodulated sequence and the emitter signal to generate a time-of-arrival (TOA) estimate of the emitter signal; and transmit the demodulated sequence and the TOA estimate to the concentrator device via the communication interface. In embodiments, the concentrator may be configured to: receive a first demodulated sequence and a first TOA estimate ($TOA_1$) from a first sensor; receive a second demodulated sequence and a second TOA estimate ($TOA_2$), from a second sensor; determine a first arbitrary timing offset ($ATO_1$) between the first demodulated sequence and the second demodulated sequence; and determine a first differential TOA estimate ($TOA_{Diff_1}$) between the first sensor and the second sensor based on the first TOA estimate ($TOA_1$), the second TOA estimate ($TOA_2$), and the arbitrary timing offset ($ATO_1$).

A method for determining a geographical position of a transmitting device is disclosed. In embodiments, the method includes: receiving, with a concentrator device, a first demodulated sequence from a first sensor, wherein the first demodulated sequence is generated based on an emitter signal received by the first sensor from the transmitting device; receiving, with the concentrator device, a first TOA estimate ($TOA_1$) from the first sensor, wherein the first TOA estimate ($TOA_1$) is based on the emitter signal and the first demodulated sequence; receiving, with the concentrator device, a second demodulated sequence from a second sensor, wherein the second demodulated sequence is generated based on the emitter signal received by the second sensor from the transmitting device; receiving, with the concentrator device, a second TOA estimate ($TOA_2$) from the second sensor, wherein the second TOA estimate ($TOA_1$) is based on the emitter signal and the second demodulated sequence; determining a first arbitrary timing offset ($ATO_1$) between the first demodulated sequence and the second demodulated sequence; determining a first differential TOA estimate ($TOA_{Diff_1}$) between the first sensor and the second sensor based on the first TOA estimate ($TOA_1$), the second TOA estimate ($TOA_2$), and the first arbitrary timing offset ($ATO_1$); and determining a position estimate of the transmitting device based at least on the first differential TOA estimate ($TOA_{Diff_1}$).

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are provided for example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

Time-difference-of-arrival (TDOA) estimation is a conventional approach used for determining a geographical position of an emitter or transmitting device (e.g., radio frequency emitter). Conventional TDOA techniques involve receiving signals from a single transmitting device at two geographically separated sensors/receivers, and cross-correlating the signals in order to estimate the TDOA for one baseline between the two sensors/receivers. By processing multiple baselines (e.g., multiple TDOA estimates between pairs of sensors), the geographical position of the transmitting device may be estimated.

The conventional TDOA estimation approach requires high-resolution digitized sample-streams of the signals received by the sensors/receivers to be transmitted to a common device (e.g., concentrator device) in order for the common device to carry out the cross-correlation. This requires high-data-rate connectivity between the respective sensors/receivers and the common device (e.g., concentrator device). Transmitting these high-resolution digitized sample-streams may be easily accommodated with a hard-wired communication structure. However, non-hardwired communication structures, such as wireless networks, may be easily overwhelmed by the high-data-rate required. In this regard, conventional TDOA estimation approaches may be incompatible in the context of wireless communication networks.

For example, consider a signal from a transmitting device (emitter) occupying a 1 MHz bandwidth. The signal may be received by a first sensor and a second sensor in geographically separate locations. In order to carry out conventional TDOA estimation, one or both of the sensors must transmit/forward the received signal such that the signals may be received by a common device (e.g., the first sensor, the second sensor, a concentrator, or the like). The signals received by the first sensor and the second sensor must be oversampled by a factor of two or more and subsequently digitized with sufficient bits to preserve the signal-to-noise ratio (SNR) and dynamic range of the received signal. For instance, a sample rate of 2 MHz with 8-bit resolution (relatively low resolution) results in a 32 Mbps data stream which must be transmitted by a single sensor. However, this is greater than the total capacity of many wireless networks. In this regard, the conventional TDOA estimation approach of this example may not be carried out in the vast majority of wireless networks.

Accordingly, embodiments of the present disclosure are directed to a system and method which cure one or more of the shortfalls of previous approaches identified above. Embodiments of the present disclosure are directed to a system for carrying out differential time-of-arrival (TOA) estimations in order to determine a geographical position of a transmitting device. More particularly, embodiments of the present disclosure are directed to a system for carrying out blind differential time-of-arrival (TOA) estimations over a wireless network. Additional embodiments of the present disclosure are directed to a method for performing blind differential time-of-arrival (TOA) estimations over a wireless network in order to determine a geographical position of a transmitting device.

It is contemplated herein that the system and method of the present disclosure may enable the transmission of lower-resolution, lower-bandwidth signals over a wireless network in order to perform differential TOA estimations. In particular, embodiments of the present disclosure may reduce the bandwidth and data transmission rate required for geographical position determinations by more than an order of magnitude. In this regard, the system and method of the present disclosure may enable geographical position determination of a transmitting device over a wireless network, which may not be carried out with conventional TDOA estimation techniques.

Figure 1:
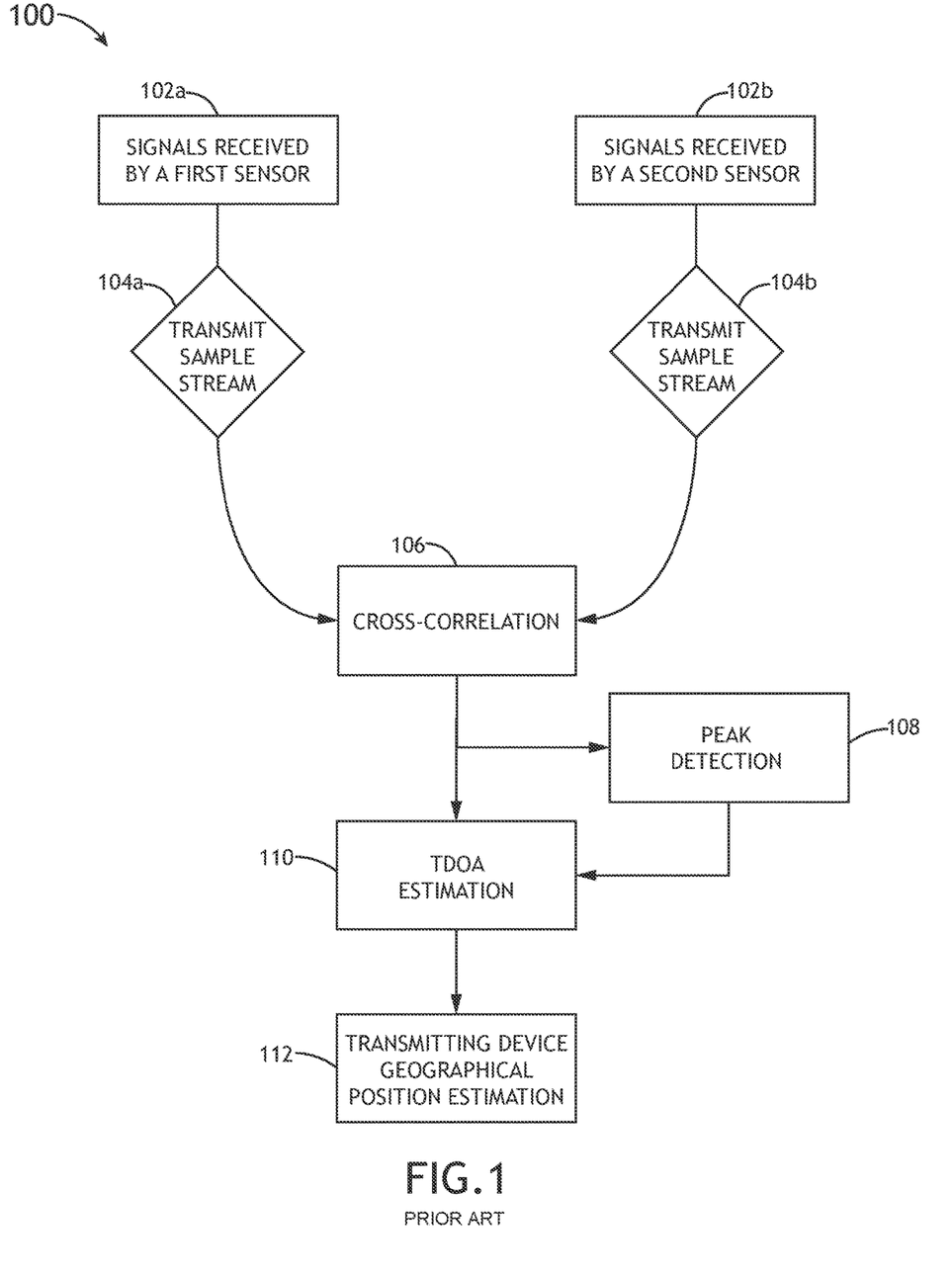
FIG. 1 illustrates a flowchart of a method for determining a geographical location of a transmitting device using time-distance-of-arrival (TDOA) estimation techniques.

FIG. 1 illustrates a flowchart of a method 100 for determining a geographical location of a transmitting device using time-distance-of-arrival (TDOA) estimation techniques. In this regard, method 100 depicted in FIG. 1 is provided as an example of conventional TDOA estimation techniques. It is contemplated herein that a brief description of conventional TDOA estimation techniques may provide a baseline against which the attendant advantages of the present disclosure may be compared.

In steps 102a and 102b, signals from a transmitting device may be received by two separate sensors. For example, as shown in FIG. 1, a first sensor may receive a signal from the transmitting device in a step 102a, and a second sensor may receive the signal from the transmitting device in a step 102b. Upon receiving the signals, the first sensor and the second sensor may each sample the received signals and digitize the respective sample streams. As noted previously herein, the signals received by the first sensor and the second sensor must be oversampled by a factor of two or more and subsequently digitized with sufficient bits to preserve the signal-to-noise ratio (SNR) and dynamic range of the received signal.

In steps 104a and 104b, the sample streams are transmitted. Due to the fact that the first sensor and the second sensor are geographically separated, at least one of the sample streams must be transmitted via a communication system (e.g., wired communication system, wireless communication system) to a common device which is configured to perform cross-correlation. In the context of a hardwired communication network, transmitting these high-resolution digitized sample streams in steps 104a, 104b may be easily accommodated. However, these high-resolution sample streams may require a higher bandwidth and data rate than is possible through wireless communication networks. Accordingly, the capacity required in steps 104a, 104b may be more than that provided by the vast majority of wireless networks.

Assuming method 100 takes place on a wired communication network or an extremely high-bandwidth wireless network, method 100 would proceed to step 106. In step 106, the sample streams are cross correlated. In step 108, peak detection is performed. In step 110, time-distance-of-arrival (TDOA) estimation is performed for any detected peak in order to generate a TDOA estimate. In step 112, multiple TDOA estimates from multiple pairs of sensors may be used to estimate a geographical position of the transmitting device.

In theory, traditional TDOA estimation techniques illustrated in method 100 may be used to determine/estimate the geographical position of a transmitting device. However, practical limitations hamper the overall effectiveness and utility of method 100. In particular, a majority of wireless networks do not exhibit the capacity and high-bandwidths required to carry out steps 104a, 104b of method 100. Additionally, the high throughput required to transmit the high-resolution digitized streams in steps 104a, 104b is difficult to carry out over long distances. These practical limitations are primarily attributable to the high-resolution digitized sample-streams which must be transmitted to enable TDOA estimation.

Accordingly, embodiments of the present disclosure are directed to a system and method which cure one or more of the shortfalls of previous approaches identified in method 100. In particular, embodiments of the present disclosure are directed to a system 200 and a method 300 configured to perform differential TOA estimation techniques in order to determine a geographical position of a transmitting device.

Figure 2A:
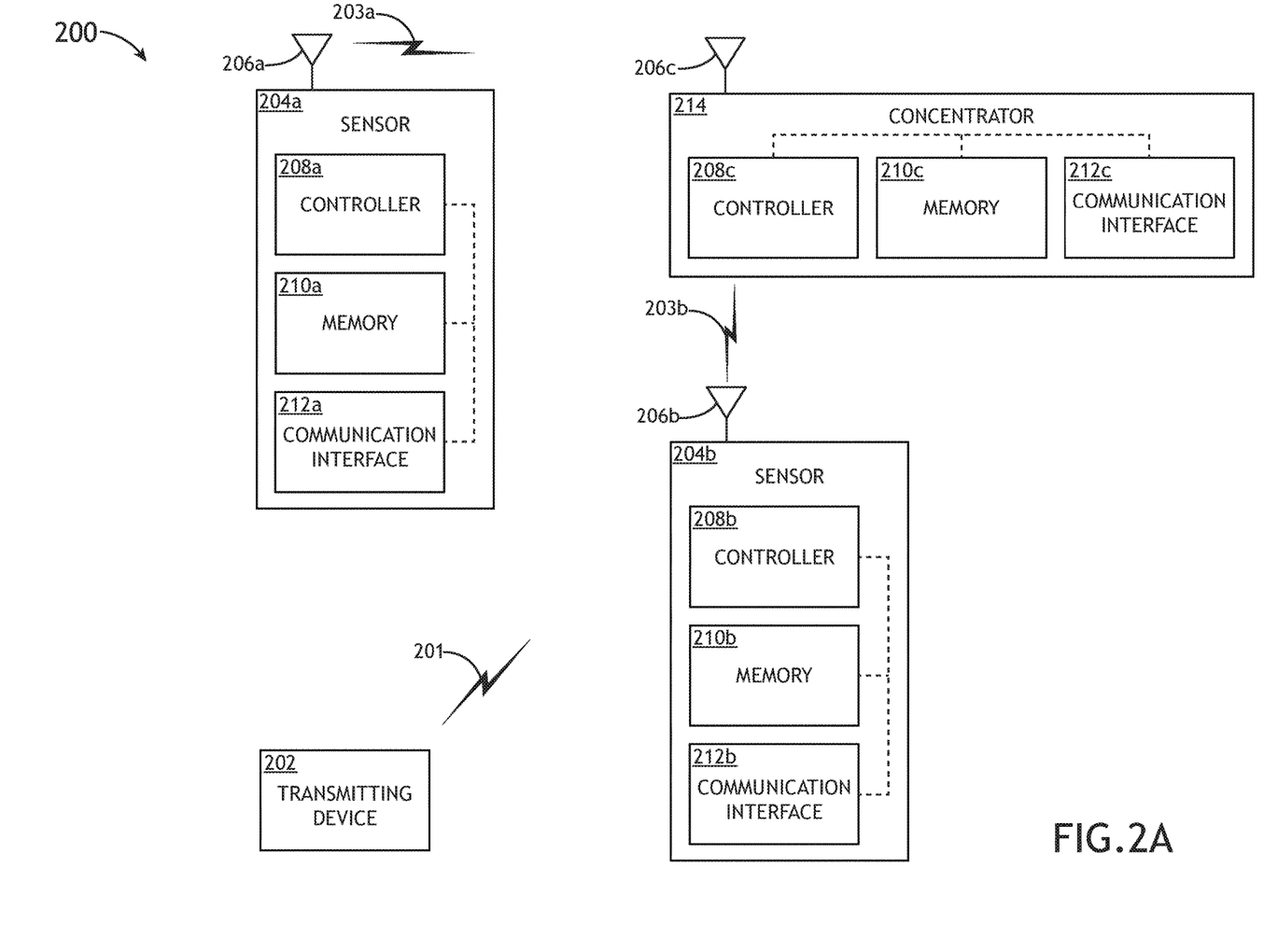
FIG. 2A illustrates a simplified block diagram of a system for determining a geographical location of a transmitting device using differential time-of-arrival (TOA) estimation techniques, in accordance with one or more embodiments of the present disclosure.

FIG. 2A illustrates a simplified block diagram of a system 200 for determining a geographical location of a transmitting device 202 using differential time-of-arrival (TOA) estimation techniques, in accordance with one or more embodiments of the present disclosure. In embodiments, the system 200 may include a transmitting device 202, two or more sensors 204a, 204b, and a concentrator device 214.

In embodiments, system 200 may be configured to perform differential time-of-arrival (TOA) techniques in order to estimate and/or determine a geographical position of the transmitting device 202. In this regard, the sensors 204a, 204b may be configured to receive an emitter signal 201 from the transmitting device 202. The transmitting device 202 may include any emitter or transmitting device known in the art. For example, transmitting device 202 may include a radio frequency (RF) transmitting device. By way of another example, transmitting device 202 may include, but is not limited to, an acoustic transmitting device, a radar device, and the like. In this regard, the emitter signals 201 may include any signals known in the art (e.g., RF signals, acoustic signals, radar signals, seismic signals, and the like).

As noted previously herein, the first sensor 204a and the second sensor 204b may be located in different geographical positions. In some embodiments, the concentrator device 214 may be located in a different geographical position as the first sensor 204a, and the second sensor 204b. In embodiments, the concentrator device 214 and each sensor 204 of the two or more sensors 204a, 204b may include, but is not limited to, a respective antenna 206 (e.g., antenna 206a, 206b, 206c), a respective controller 208 (e.g., controller 208a, 208b, 208c, etc.), a respective memory 210 (e.g., memory 210a, 210b, 210c, etc.), and a respective communication interface 212 (e.g., communication interface 212a, 212b, 212c, etc.). It is noted herein that system 200 may include any number of sensors 204a-204n configured to receive emitter signals 201 from the transmitting device 202.

The antenna 206a, 206b of the sensors 204a, 204b may be configured to receive emitter signals 201 from the transmitting device 202. Additionally, the antenna 206a, 206b of the sensors 204a, 204b may be configured to transmit signals 203a, 203b. In this regard, the antenna 206c of the concentrator device 214 may be configured to receive signals 203a, 203b from the sensors 204a, 204b. In some embodiments, a sensor 204a, 204b may include a plurality of antennas configured to receive and/or transmit signals on one or more frequency bands. For example, the first sensor 204a may include a first antenna configured to receive emitter signals 201 on a first frequency band, and a second antenna configured to transmit signals 203a on a second frequency band.

The controller 206a, 206b, 206c provides processing functionality for at least the respective sensor 204a, 204b and/or concentrator device 214 and can include any number of processors, micro-controllers, circuitry, field programmable gate array (FPGA) or other processing systems, and resident or external memory for storing data, executable code, and other information accessed or generated by the sensor 204a, 204b. The controller 208a, 208b, 208c can execute one or more software programs embodied in a non-transitory computer readable medium (e.g., memory 210a, 210b, 210c) that implement techniques described herein. The controller 208a, 208b, 208c is not limited by the materials from which it is formed or the processing mechanisms employed therein and, as such, can be implemented via semiconductor(s) and/or transistors (e.g., using electronic integrated circuit (IC) components), and so forth.

The memory 210a, 210b, 210c can be an example of tangible, computer-readable storage medium that provides storage functionality to store various data and/or program code associated with operation of the concentrator device 214/sensor 204a, 204b/controller 208a, 208b, such as software programs and/or code segments, or other data to instruct the controller 208a, 208b, 208c and possibly other components of the concentrator 214/sensor 204a, 204b, to perform the functionality described herein. Thus, the memory 210a, 210b, 210c can store data, such as a program of instructions for operating the concentrator device 214/sensor 204a, 204b, including its components (e.g., controller 208a, 208b, 208c, communication interface 212a, 212b, 212c, etc.), and so forth. It should be noted that while a single memory 210a, 210b, 210c is described, a wide variety of types and combinations of memory (e.g., tangible, non-transitory memory) can be employed. The memory 210a, 210b, 210c can be integral with the controller 208a, 208b, 208c, can comprise stand-alone memory, or can be a combination of both. Some examples of the memory 210a, 210b, 210c can include removable and non-removable memory components, such as random-access memory (RAM), read-only memory (ROM), flash memory (e.g., a secure digital (SD) memory card, a mini-SD memory card, and/or a micro-SD memory card), solid-state drive (SSD) memory, magnetic memory, optical memory, universal serial bus (USB) memory devices, hard disk memory, external memory, and so forth.

The communication interface 212a, 212b, 212, can be operatively configured to communicate with components of the concentrator device 214/sensor 204a, 204b. For example, the communication interface 212a, 212b, 212c, can be configured to retrieve data from the controller 208a, 208b, 208c, or other devices, transmit data for storage in the memory 210a, 210b, 210c, retrieve data from storage in the memory 210a, 210b, 210c, and so forth. The communication interface 212a, 212b, 212c, can also be communicatively coupled with the controller 208a, 208b, 208c, to facilitate data transfer between components of the concentrator device 214, sensor 204a, 204b, and the controller 208a, 208b, 208c. It should be noted that while the communication interface 212a, 212b, 212c, is described as a component of the concentrator device 214/sensor 204a, 204b, one or more components of the communication interface 212a, 212b, 212c, can be implemented as external components communicatively coupled to the concentrator device 214/sensor 204a, 204b via a wired and/or wireless connection. The concentrator device 214/sensor 204a, 204b can also include and/or connect to one or more input/output (I/O) devices. In embodiments, the concentrator device 214/sensor 204a, 204b includes or is coupled to a transmitter, receiver, transceiver, physical connection interface, or any combination thereof.

It is contemplated herein that the communication interface 212a, 212b, 212c of the concentrator device 214/sensor 204a, 204b may be configured to communicatively couple to additional component of the system 200 using any wireless communication techniques known in the art including, but not limited to, GSM, GPRS, CDMA, EV-DO, EDGE, WiMAX, 3G, 4G, 4G LTE, 5G, WiFi protocols, LoRa, and the like.

In embodiments, the controller 208a, 208b of a sensor 204a, 204b is configured to carry out various steps and functions of the present disclosure. The controller 208a, 208b of the sensors 204a, 204b may be configured to: receive an emitter signal 201 from the communication interface 212a, 212b; store each emitter signal 201 in memory 210a, 120b; demodulate each emitter signal 201 to generate a demodulated sequence of the emitter signal 201; correlate the demodulated sequence and the emitter signal 201 to generate a time-of-arrival (TOA) estimate of the emitter signal 201; and transmit the demodulated sequence and the TOA estimate to the concentrator device 214 via the communication interface 212a, 212b and signals 203a, 203b.

Similarly, in additional embodiments, the controller 208c of the concentrator device 214 is configured to carry out various steps and functions of the present disclosure. The controller 208c of the concentrator device 214 may be configured to: receive a first demodulated sequence and a first TOA estimate ($TOA_1$) from a first sensor 204a; receive a second demodulated sequence and a second TOA estimate ($TOA_2$), from a second sensor 204b; determine a first arbitrary timing offset ($ATO_1$) between the first demodulated sequence and the second demodulated sequence; and determine a first differential TOA estimate ($TOA_{Diff_1}$) between the first sensor 204a and the second sensor 204b based on the first TOA estimate ($TOA_1$), the second TOA estimate ($TOA_2$), and the arbitrary timing offset ($ATO_1$).

Figure 3A:
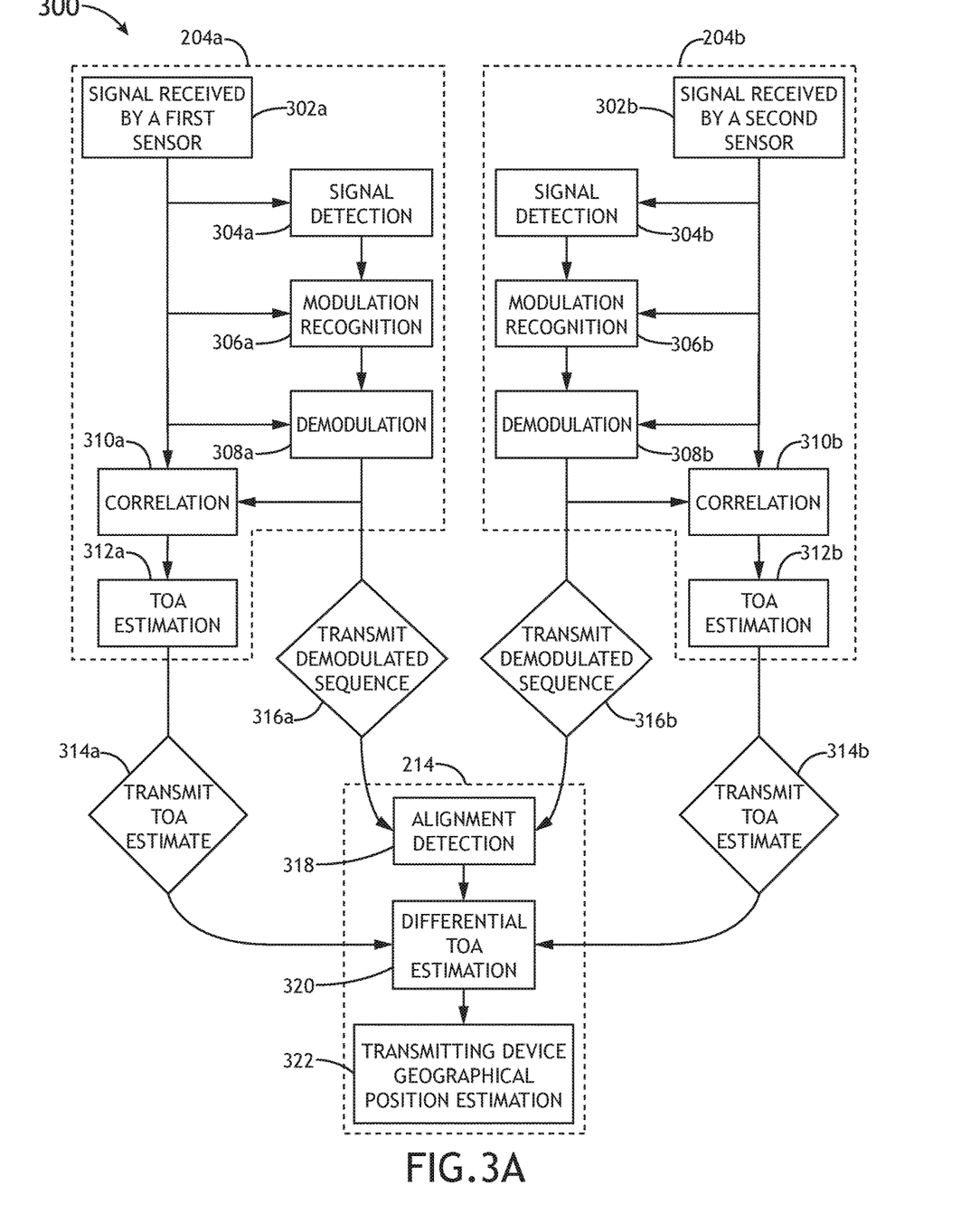
FIG. 3A illustrates a flowchart of a method for determining a geographical location of a transmitting device using differential TOA estimation techniques, in accordance with one or more embodiments of the present disclosure.
Figure 3B:
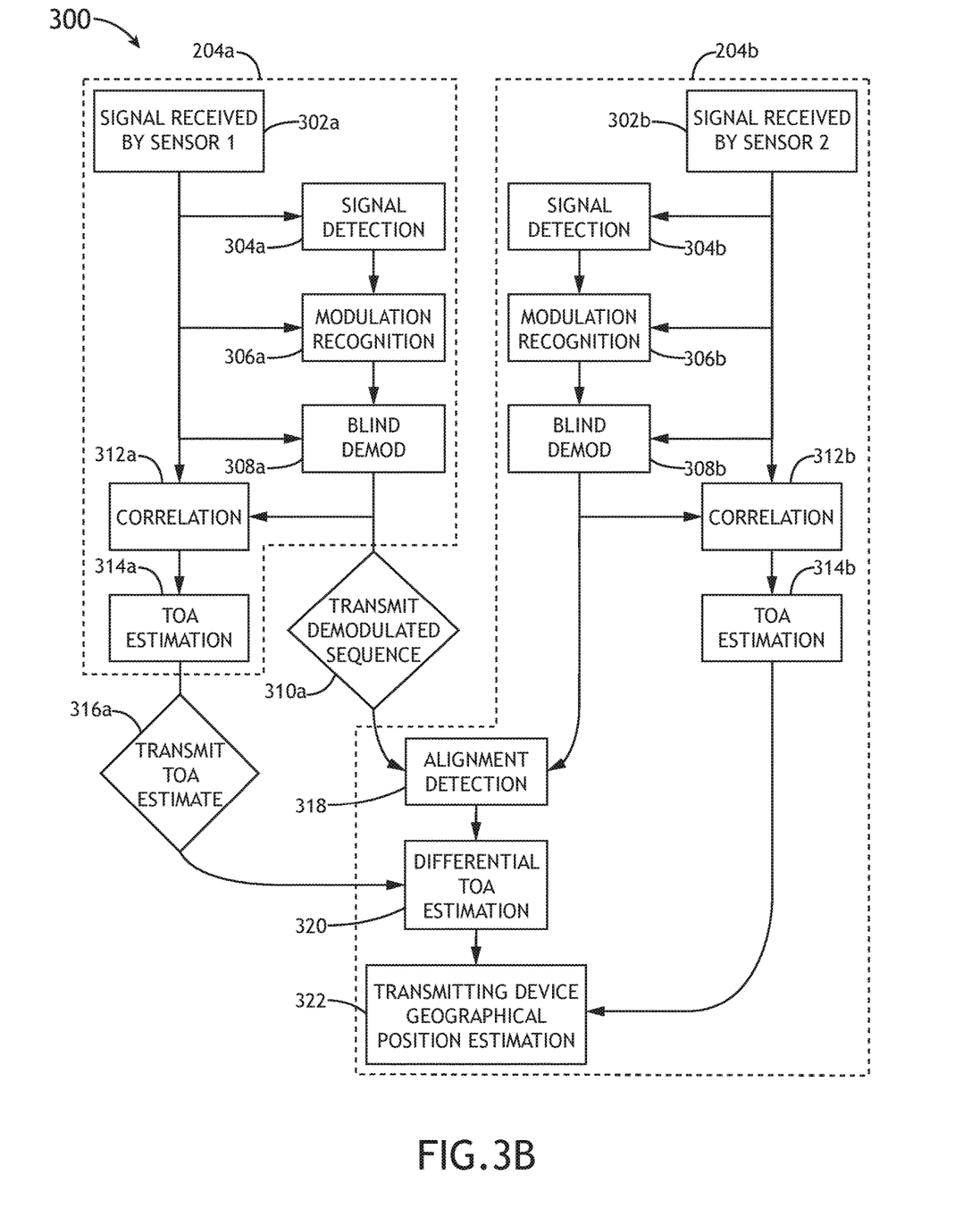
FIG. 3B illustrates a flowchart of a method for determining a geographical location of a transmitting device using differential TOA estimation techniques, in accordance with one or more embodiments of the present disclosure.

The various steps and functions carried out by the various components of system 200 may be further understood with reference to FIGS. 3A and 3B.

FIG. 3A illustrates a flowchart of a method 300 for determining a geographical location of a transmitting device using differential time-distance-of-arrival (TOA) estimation techniques, in accordance with one or more embodiments of the present disclosure.

As shown in FIG. 3A, various steps of method 300 may be configured to take place on/within varying components of system 200. For example, steps 302-314 may be carried out by the first sensor 204a and the second sensor 204b respectively, whereas step 318-322 may be carried out by the concentrator device 214.

In steps 302a, 302b, signals are received by a first sensor and a second sensor. For example, a transmitting device 202 may transmit an emitter signal 201. The controllers 208a, 208b may then be configured to receive the emitter signal 201 from the communication interface 212a, 212b, wherein the first controller 208a is configured to receive emitter signal 201, and the second controller 208b is configured to receive emitter signal 201. The first sensor 204a and the second sensor 204b may be configured to store the emitter signal 201 in memory 210a, 120b. The sensors 204a, 204b may include any sensor device known in the art configured to receive emitter signals 201.

In embodiments, the controllers 208a, 208b may be configured to digitize the received emitter signals 201 in order to perform digital processing and/or signal recognition. For example, the controllers 208a, 208b may be configured to digitize the received emitter signals and store the digitized signals in memory 210a, 210b. However, it is contemplated herein that embodiments of the present disclosure may be carried out by any mix of analog and/or digital processing.

In embodiments, the first sensor 204a and the second sensor 204b may be spatially separated such that they are located in geographically different positions. It is contemplated herein that the sensors 204a, 204b may be stationary or mobile. In embodiments, the geographical positions of the first sensor 204a and the second sensor 204b may be known. For example, with stationary sensors 204a, 204b, the geographical position of each sensor 204a, 204b may be pre-defined and known. By way of another example, the first sensor 204a and the second sensor 204b may include geographical positioning units (e.g., Global Positioning System (GPS) units, Global Navigation Satellite System (GNSS) units, and the like) configured to determine a geographical position of each sensor 204a, 204b. The geographical position of each sensor 204a, 204b may be stored in memory 210a, 210b. In embodiments, the first sensor 204a and the second sensor 204b may be configured to run the same internal clock such that the internal clocks of the first sensor 204a and the second sensor 204b are identical.

In steps 304a, 304b, signal detection is performed by each of the sensors. For example, the first controller 208a and the second controller 208b may be configured to determine when a signal (e.g., emitter signal 201) is present and received by the respective sensors 204a, 204b. It is noted herein that signal detection in steps 304a, 304b may be carried out using any techniques known in the art. For example, signal detection may be performed by radiometric detection, power detection, and the like. Upon detection of a signal, method 300 may proceed to steps 306a and 306b.

In steps 306a, 306b, modulation recognition is performed. In some embodiments, the sensors 204a, 204b may not know what modulation technique will be employed by the transmitting device 202. Accordingly, during modulation recognition, the controller 208a, 208b may be configured to determine the type of modulation employed by the transmitting device 202 when transmitting the emitter signal 201. The controller 208a, 208b may be configured to identify any modulation technique known in the art including, but not limited to, minimum-shift keying (MSK), phase-shift keying (PSK), amplitude-shift keying (ASK), decision feedback differential modulation (DFDM), binary modulation, and the like.

In steps 308a, 308b, demodulation is carried out on the emitter signals to generate a demodulated sequence. For example, upon determination of the type of modulation being employed, the first controller 208a may be configured to demodulate the emitter signal 201 to generate a first demodulated sequence, and the second controller 208b may be configured to demodulate the emitter signal 201b to generate a second demodulated sequence. In embodiments, the controller 208a, 208b may be configured to store the generated demodulated sequences in memory 210a, 210b.

During demodulation, the controller 208a, 208b may be configured to retrieve signal values (e.g., a demodulated sequence) of the carrier signal of the emitter signal 201. For example, if the controller 208a, 208b determines binary modulation was employed within the emitter signal 201, the demodulated sequence may include a sequence of "0"s and "1" s. It is noted herein that the controller 208a, 208b may be configured to generate a demodulated sequence despite the existence of bit errors in the received emitter signal 201. In some embodiments, the controller 208a, 208b may be configured to perform "blind demodulation." Blind demodulation may be used throughout the present disclosure to refer to demodulation carried out without the aid of known reference sequences in the modulated signal (e.g., emitter signal 201).

It is noted herein that, in some embodiments, steps 304a, 304b, steps 306a, 306b, and steps 308a, 308b may be combined into a single step. For example, in embodiments where the controller 208a, 208b know which type of modulation technique will be implemented by the transmitting device 202, signal detection (steps 304a, 304b), modulation recognition (steps 306a, 306b), and demodulation (steps 308a, 308b) may be carried out substantially simultaneously in a single step.

In steps 310a, 310b, cross-correlation is performed between the received emitter signals and the generated demodulation sequences. For example, the controller 208a, 208b may be configured to receive the originally received emitter signal 201 and the demodulated sequence generated in steps 308a, 308, and perform cross-correlation between the emitter signal 201 and the demodulated sequence. It is noted herein that the demodulated sequence and the data associated with the originally received emitter signal 201 may be retrieved from memory 210a, 210b.

During correlation in steps 310a, 310b, the controller 208a, 208b may be configured to cross-correlate the emitter signal 201 and the demodulated sequence in order to perform peak detection of signal intensity (e.g., signal magnitude, signal power) over time in order to determine a time-of-arrival (TOA) of the emitter signal 201. In practice, the controller 208a, 208b may be configured to determine a peak in a graph of signal intensity (e.g., signal magnitude, signal power) as a function of time as the TOA of the emitter signal 201.

In steps 312a, 312b, time-of-arrival (TOA) estimation is performed. For example, the controller 208a, 208b may be configured to determine a peak in a graph of signal intensity (e.g., signal magnitude, signal power) vs. time as the TOA estimate of the emitter signal 201. Due to the fact that the first sensor 204a and the second sensor 204b are located in geographically different positions, the TOA estimate of the first sensor 204a ($TOA_1$) may be different from the TOA estimate of the second sensor 204b ($TOA_2$). For instance, the first controller 208a may generate a first TOA estimate ($TOA_1$), and the second controller 208b may generate a second TOA estimate ($TOA_2$), wherein the second TOA estimate ($TOA_2$) is different from the first TOA estimate ($TOA_1$). In embodiments, the controller 208a, 208b may be configured to store the generated first TOA estimate ($TOA_1$) and the generated second TOA estimate ($TOA_2$) in memory 210a, 210b.

In steps 314a, 314b, the first TOA estimate ($TOA_1$) and the second TOA estimate ($TOA_2$) are transmitted to the concentrator device 214. Similarly, in steps 316a, 316b, the first demodulated sequence and the second demodulated sequence are transmitted to the concentrator device 214. For example, the first controller 208a may be configured to retrieve the first demodulated sequence and the first TOA estimate ($TOA_1$) from memory 210a, and transmit the first demodulated sequence and the first TOA estimate ($TOA_1$) to the concentrator device 214. By way of another example, the second controller 208b may be configured to retrieve the second demodulated sequence and the second TOA estimate ($TOA_2$) from memory 210b, and transmit the second demodulated sequence and the second TOA estimate ($TOA_2$) to the concentrator device 214.

In embodiments, the concentrator device 214 may be located in a geographical position which is different from the geographical positions of the first sensor 204a and the second sensor 204b. In this regard, the first demodulated sequence, second demodulated sequence, first TOA estimate ($TOA_1$), and second TOA estimate ($TOA_2$) may be transmitted via a hardwired communication network or a wireless communication network.

In embodiments, system 200 and method 300 may significantly reduce the resolution of data which must be transmitted by the sensors 204a, 204b. For example, in method 100, steps 104a, 104b required high-resolution sample streams to be transmitted over a wireless network. These high-resolution sample streams require extremely high bandwidth and throughput communication systems which far exceed the capabilities of most wireless networks.

Comparatively, transmitting only the demodulated sequences and the TOA estimates in steps 314a, 314b, 316a, and 316b may dramatically reduce the resolution and required throughput of the transmitted data in method 300. In the context of wireless networks, transmission of low-resolution demodulated sequences and TOA estimates may significantly reduce the burden placed on the wireless network. In this regard, steps 314a, 314b, 316a, and 316b of method 300 may significantly reduce the requisite bandwidth and throughput of the associated network, which is essential for wireless networks.

In particular, the differential TOA estimation technique of method 300 requires only the low-resolution demodulated sequences and TOA estimates (e.g., $TOA_1$, $TOA_2$) to be transmitted over a communication network, whereas the conventional TDOA estimation techniques require high-resolution sample streams to be transmitted. Depending on the number of bits required to represent a demodulated signal (e.g., 1 bit for binary modulation, 2 bits for quaternary (4-ary) modulation, and the like), the differential TDOA estimation approach may reduce the required connectivity/throughput of the communication network by more than an order of magnitude.

By way of example, consider again the above example of a binary emitter signal from a transmitting device occupying a 1 MHz bandwidth and 8-bit resolution. Under the conventional TDOA estimation approach (e.g., method 100), the emitter signal would have to be sampled at a sample rate of 2 MHz, yielding a 32 Mbps data stream which must be transmitted by the sensors (steps 104a, 104b). Now consider the same emitter signal using the differential TOA estimation technique of the present disclosure (e.g., method 100). With the same binary, 1 MHz and 8-bit resolution emitter signal, the demodulated sequences transmitted in steps 316a, 316b would require a data stream of only 1 Mbps. Considering the TOA estimates (e.g., first TOA estimate ($TOA_1$), and second TOA estimate ($TOA_2$)) represent only minute amounts of additional data, the effective data stream is 32 Mbps for method 100 and approximately 1 Mbps for method 300. Accordingly, embodiments of the present disclosure may reduce the required data rate by a factor of thirty-two for some emitter signals 201.

In embodiments, the required data rate required to transmit the demodulated sequences in steps 316a, 316b may be further reduced by transmitting only a portion of the demodulated sequences, rather than the entirety of each demodulated sequence. For example, the first controller 208a may be configured to retrieve the first demodulated sequence from memory 210a, truncate the demodulated sequence, store the truncated demodulated sequence in memory 210a, and transmit the truncated demodulated sequence to the concentrator device 214 via communication interface 212a. It is noted herein that the demodulated sequences transmitted in steps 316a, 316b need only be long enough to enable alignment detection and timing offset determination in subsequent steps of method 300.

In some embodiments, the first sensor 204a and the second sensor 204b may be configured to transmit other information/data in addition to the demodulated sequences and TOA estimates (e.g., $TOA_1$, $TOA_2$) transmitted in steps 314a, 314b, 216a, and 316b. For example, upon receiving emitter signal 201, the controller 208a, 208b may be configured to determine a signal-to-noise ratio (SNR) value (e.g., $SNR_1$, $SNR_2$) of the emitter signal 201 at each respective sensor 204a, 204b and store the determined SNR values (e.g., $SNR_1$, $SNR_2$) in memory 210a, 210b. Subsequently, the controller 208a, 208b may be configured to transmit the determined SNR values, via communication interface 212a, 212b, to the concentrator device 214. In this regard, the concentrator device 214 may be configured to receive a first signal-to-noise ratio ($SNR_1$) associated with the first sensor 204a and a second signal-to-noise ratio ($SNR_2$) associated with the second sensor 204b. The concentrator device 214 may be configured to use the received SNR values in subsequent steps in order to weigh respective differential TOA estimates during geographical position processing, as will be described in further detail herein.

By way of another example, the controller 208a, 208b may be configured to transmit determined geographical positions of the respective sensors 204a, 204b in addition to the transmitted demodulated sequences and TOA estimates (e.g., $TOA_1$, $TOA_2$). For instance, as noted previously herein, the sensors 204a, 204b may include GPS units configured to determine and store a geographical position of the respective sensor 204a, 204b in memory 210a, 210b. The controller 208a, 208b may then be configured to transmit the determined geographical positions, via communication interface 212a, 212b, to the concentrator device 214.

In a step 318, the concentrator device 214 performs alignment detection, and an arbitrary timing offset (ATO) is determined based on the alignment detection. As noted previously herein, the first sensor 204a and the second sensor 204b may be located in geographically different positions, and may therefore receive the emitter signal 201 at different times. Reception of the emitter signal 201 at slightly different times may therefore result in an arbitrary timing offset (ATO) between the first demodulated sequence generated by the first sensor 204a and the second demodulated sequence generated by the second sensor 204b. Accordingly, the controller 208c of the concentrator device 214 may be configured to determine an arbitrary timing offset (ATO) between the first demodulated sequence and the second demodulated sequence. In embodiments, the controller 208c is configured to store the generated ATO in memory.

It is contemplated herein that an arbitrary phase shift/phase offset may exist between the first demodulated sequence and the second demodulated sequence. For example, in the context of binary modulation, the first controller 208a may generate a first demodulated sequence including a series of "0"s and "1" s. Due to the fact that the sensors 204a, 204b may be performing blind demodulation, the second controller 208a may generate a second demodulated sequence including a series of "0"s and "1"s wherein the "0"s and "1"s are flipped as compared to the first demodulated sequence. This arbitrary phase shift may be a result of blind demodulation. Additionally, the controller 208c may be configured to ignore an arbitrary phase offset and/or adjust a demodulated sequence in order to remove effects of the arbitrary phase offset (e.g., adjust the arbitrary phase offset) when carrying out alignment detection and ATO determination in step 318.

In a step 320, a differential time-of-arrival (TOA) estimate is generated. For example, the controller 208c of the concentrator device 214 may be configured to determine a differential TOA estimate ($TOA_{Diff}$) between the first sensor 204a and the second sensor 204b based on the first TOA estimate ($TOA_1$) received by the first sensor 204a (step 314a), the second TOA estimate ($TOA_2$) received by the second sensor 204b (step 314b), and the determined arbitrary timing offset (ATO).

The differential TOA estimate ($TOA_{Diff}$) between the first sensor 204a and the second sensor 204b may be regarded as a single baseline between the first sensor 204a and the second sensor 204b. In embodiments, the controller 208c may be configured to determine the differential TOA estimate ($TOA_{Diff}$) by finding a difference between the first TOA estimate ($TOA_1$) and the second TOA estimate ($TOA_2$), and adjusting the resulting difference by the arbitrary timing offset (ATO). For example, the differential TOA estimate ($TOA_{Diff}$) between the first sensor 204a and the second sensor 204b may be defined according to Equation 1:

$$TOA_{Diff} = (TOA_2 - TOA_1) - ATO \qquad (1)$$

In a step 322, a geographical position of the transmitting device is determined and/or estimated. For example, the controller 208c of the concentrator device 214 may be configured to determine a geographical position estimate of the transmitting device 202 based at least on a first differential TOA estimate ($TOA_{Diff_1}$) between the first sensor 204a and the second sensor 204b. For instance, the controller 208c may be configured to determine a geographical position estimate of the transmitting device 202 based at least on a determined geographical position of the first sensor 204a, a determined geographical position of the second sensor 204b, and the first differential TOA estimate (TOA$_{Diff_1}$).

In practice, determining the geographical position of the transmitting device 202 may be carried out using multiple baselines (e.g., multiple differential TOA estimates (TOA$_{Diff}$)) between multiple pairs of sensors 204a-204n. For example, in addition to determining the first differential TOA estimate (TOA$_{Diff_1}$) between the first sensor 204a and the second sensor 204b, the controller 208c may be configured to determine a second differential TOA estimate (TOA$_{Diff_2}$) between the third sensor 204c and a fourth sensor 204d, wherein determining the second differential TOA estimate (TOA$_{Diff_2}$) is carried out in the same manner as determining the first differential TOA estimate (TOA$_{Diff_1}$).

For instance, the controller 208c may be configured to determine a the first differential TOA estimate (TOA$_{Diff_1}$), and may be configured to determine a second differential TOA estimate (TOA$_{Diff_2}$) between a third sensor 204c and a fourth sensor 204d by determining TOA$_{Diff_2}$=(TOA$_4$−TOA$_3$)−ATO$_2$, wherein TOA$_3$ is received from the third sensor 204c, TOA$_4$ is received from the fourth sensor 204d, and ATO$_2$ is an arbitrary timing offset between demodulated sequences of the third sensor 204c and the fourth sensor 204d. Continuing with the same example, the controller 208c may be configured to determine a geographical position estimate of the transmitting device 202 based at least on the first differential TOA estimate (TOA$_{Diff_1}$) and the second differential TOA estimate (TOA$_{Diff_2}$).

It is noted herein that the controller 208c may be configured to determine a geographical position estimate of the transmitting device 202 using any number of differential TOA estimates (TOA$_{Diff_1}$-TOA$_{Diff_n}$) between any two pairs of sensors 204a-204n (e.g., any N number of baselines). Additionally, it is contemplated herein that a single sensor 204 may be a part of any number of baselines (e.g., differential TOA estimates). For example, the first sensor 204a may be used to determine the first differential TOA estimate (TOA$_{Diff_1}$) between the first sensor 204a and the second sensor 204b, wherein TOA$_{Diff_1}$=(TOA$_2$−TOA$_1$)−ATO$_1$. Additionally, the first sensor 204a may be used to determine a third differential TOA estimate (TOA$_{Diff_3}$) between the first sensor 204a and the third sensor 204c, wherein TOA$_{Diff_3}$=(TOA$_3$−TOA$_1$)−ATO$_3$, wherein ATO$_3$ is an arbitrary timing offset between demodulated sequences of the first sensor 204a and the third sensor 204c.

In embodiments, the controller 208c may be configured to determine a geographical position estimate of the transmitting device 202 by weighting differential TOA estimates between sensors 204a-204n based on the determined SNR values of respective sensors. For example, the controller 208c may be configured to determine a geographical position estimate of the transmitting device 202 using a first differential TOA estimate (TOA$_{Diff_1}$) between a first sensor 204a and a second sensor 204b, a second differential TOA estimate (TOA$_{Diff_2}$) between a third sensor 204a and a fourth sensor 204d, and a third differential TOA estimate (TOA$_{Diff_3}$) between the first sensor 204a and the third sensor 204c. In this example, the concentrator device 214 may further receive SNR values associated with each sensor 204a-204d (e.g., SNR$_1$, SNR$_2$, SNR$_3$, SNR$_4$). If the SNR value of the first sensor 204a (e.g., SNR$_1$) is lower than that of the second sensor 204b, third sensor 204c, and fourth sensor 204d, the concentrator device 214 may be configured to weigh the first differential TOA estimate (TOA$_{Diff_1}$) and the third differential TOA estimate (TOA$_{Diff_3}$) less than the second differential TOA estimate (TOA$_{Diff_2}$) when determining the geographical position of the transmitting device 202.

While FIG. 2A and FIG. 3A are shown and described in the context of various functions being performed on a first sensor 204a, a second sensor 204b, and a concentrator device 214, this is not to be regarded as a limitation of the present disclosure. In particular, it is contemplated herein that a sensor 204 may be configured to carry out the functions of the concentrator device 214. In this regard, the first sensor 204a or the second sensor 204b may function as the concentrator device 214. Additionally and/or alternatively, it may be said that the concentrator device 214 includes one of the sensors 204a, 204b. This may be further understood with reference to FIG. 2B.

Figure 2B:
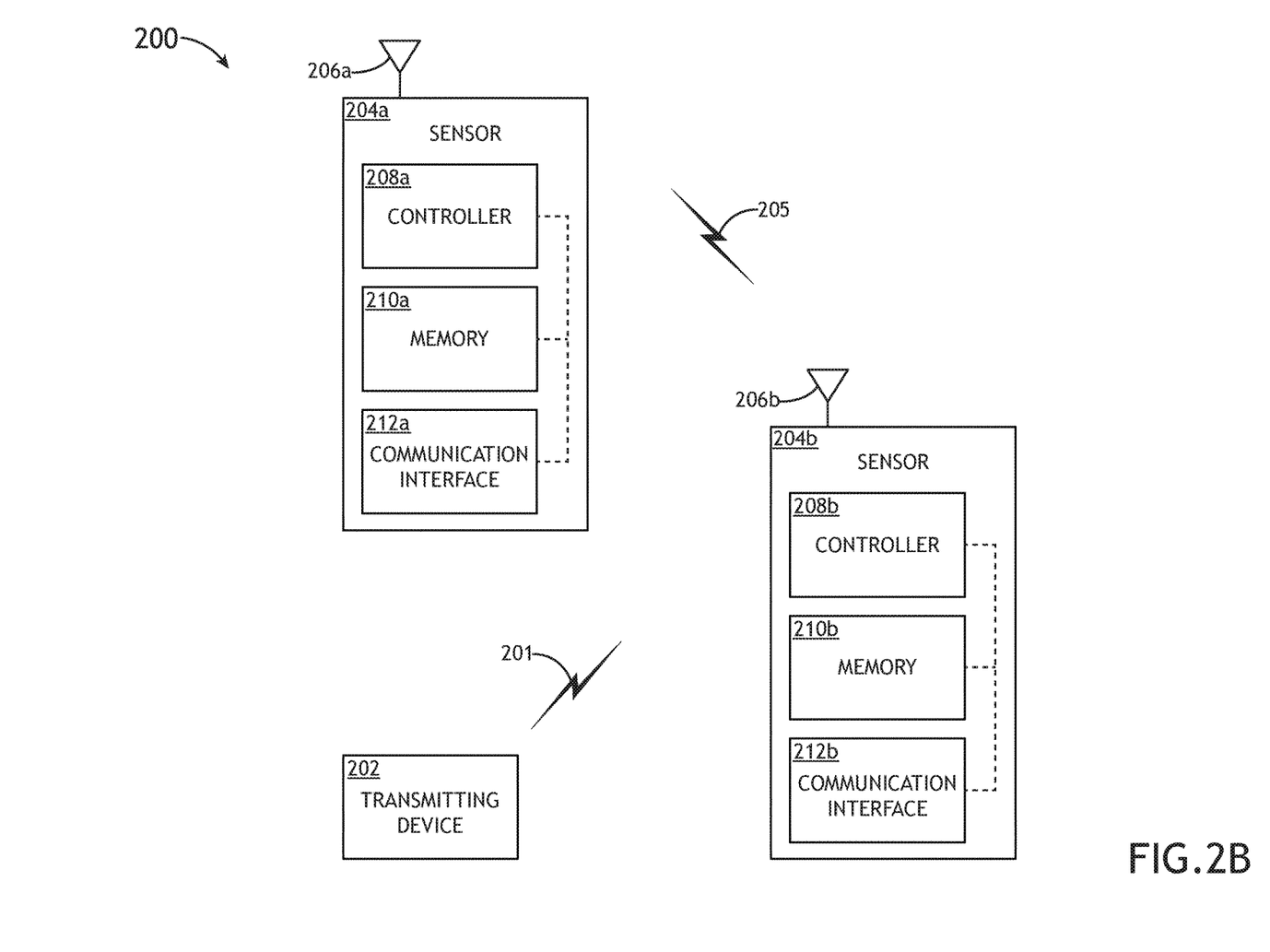
FIG. 2B illustrates a simplified block diagram of a system for determining a geographical location of a transmitting device using differential TOA estimation techniques, in accordance with one or more embodiments of the present disclosure.

FIG. 2B illustrates a simplified block diagram of a system 200 for determining a geographical location of a transmitting device 202 using differential time-of-arrival (TOA) estimation techniques, in accordance with one or more embodiments of the present disclosure. It is noted herein that any description associated with system 200 illustrated in FIG. 2A may be regarded as applying to system 200 illustrated in FIG. 2B, unless noted otherwise herein.

As shown in FIG. 2A, the system 200 may include a transmitting device 202, a first sensor 204a, and a second sensor 204b, wherein the first sensor 204a and the second sensor 204b are communicatively coupled. Instead of transmitting signals 203a, 203b to a concentrator device 214, as shown in FIG. 2A, the first sensor 204a may be configured to transmit signals 205 to the second sensor 204b to carry out various steps/functions of the present disclosure. In this regard, the controller 208b of the second sensor 204b depicted in FIG. 2B may be configured to carry out the functions of the controller 208c of the concentrator device 214 shown and described in FIGS. 2A and 3A. This may be further understood with reference to FIG. 3A.

FIG. 3B illustrates a flowchart of a method 300 for determining a geographical location of a transmitting device 202 using differential time-distance-of-arrival (TOA) estimation techniques, in accordance with one or more embodiments of the present disclosure. It is noted herein that any description associated with method 300 illustrated in FIG. 3A may be regarded as applying to method 300 illustrated in FIG. 3B, unless noted otherwise herein.

As shown in FIG. 3B, steps which were previously carried out by the concentrator device 214 may instead be carried out by a sensor 204. For example, in FIG. 3A, step 318-322 of method 300 were shown and described as being carried out by the concentrator device 214. Conversely, in in FIG. 3B, step 318-322 of method 300 are shown and described as being carried out by the second sensor 204b.

It is noted herein that using the second sensor 204b as the concentrator device 214 (or including the second sensor 204b within the concentrator device 214) may reduce the amount of data which must be transmitted through the communication network. For example, as shown in FIG. 3B, transmitting the second demodulated sequence and the second TOA estimate (TOA$_2$) from the second sensor 204b to the concentrator device 214 may be omitted due to the fact that the functions of the concentrator device 214 are being carried out by the second sensor 204b.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A system for determining a differential time-distance-of-arrival (TOA) estimate of a transmitting device, comprising:
    a concentrator device; and
    a plurality of sensors communicatively coupled to the concentrator device, wherein a sensor of the plurality of sensors comprises:
        a communication interface configured to receive an emitter signal from a transmitting device; and
        a controller communicatively coupled to the communication interface, the controller configured to:
            receive the emitter signal from the communication interface;
            demodulate the emitter signal to generate a demodulated sequence of the emitter signal;
            correlate the demodulated sequence and the emitter signal to generate a time-of-arrival (TOA) estimate of the emitter signal;
            transmit the demodulated sequence and the TOA estimate to the concentrator device via the communication interface,
    wherein the concentrator device is configured to:
        receive a first demodulated sequence and a first TOA estimate ($TOA_1$) from a first sensor;
        receive a second demodulated sequence and a second TOA estimate ($TOA_2$), from a second sensor;
        determine a first arbitrary timing offset ($ATO_1$) between the first demodulated sequence and the second demodulated sequence; and
        determine a first differential TOA estimate ($TOA_{Diff_1}$) between the first sensor and the second sensor based on the first TOA estimate ($TOA_1$), the second TOA estimate ($TOA_2$), and the arbitrary timing offset ($ATO_1$).

2. The system of claim 1, wherein the concentrator device is further configured to:
    determine a geographical position estimate of the transmitting device based at least on the first differential TOA estimate ($TOA_{Diff_1}$).

3. The system of claim 2, wherein determining the geographical position estimate of the transmitting device based at least on the first differential TOA estimate ($TOA_{Diff_1}$) comprises:
    determining a geographical position of the first sensor;
    determining a geographical position of the second sensor; and
    determining the geographical position estimate of the transmitting device based at least on the first differential TOA estimate ($TOA_{Diff_1}$), the determined position of the first sensor, and the determined position of the second sensor.

4. The system of claim 2, wherein the concentrator device is further configured to:
    receive a first signal-to-noise ratio ($SNR_1$) associated with the first sensor; and
    receive a second signal-to-noise ratio ($SNR_2$) associated with the second sensor.

5. The system of claim 4, wherein determining the position estimate of the transmitting device based at least on the first differential TOA estimate ($TOA_{Diff_1}$) comprises:
    determining the geographical position estimate of the transmitting device based at least on the first differential TOA estimate ($TOA_{Diff_1}$), and $SNR_1$.

6. The system of claim 1, wherein the concentrator comprises a sensor of the plurality of sensors.

7. The system of claim 1, wherein the first differential TOA estimate ($TOA_{Diff_1}$) is defined by:

$$TOA_{Diff_1} = (TOA_2 - TOA_1) - ATO_1.$$

8. The system of claim 1, wherein the concentrator device is further configured to:
    receive a third demodulated sequence and a third TOA estimate ($TOA_3$) from a third sensor;
    receive a fourth demodulated sequence and a fourth TOA estimate ($TOA_4$), from a fourth sensor;
    determine a second arbitrary timing offset ($ATO_2$) between the third demodulated sequence and the fourth demodulated sequence; and
    determine a second differential TOA estimate ($TOA_{Diff_2}$) between the third sensor and the fourth sensor based on the third TOA estimate ($TOA_3$), the fourth TOA estimate ($TOA_4$), and the second arbitrary timing offset ($ATO_2$).

9. The system of claim 8, wherein the concentrator device is further configured to:
    determine a third arbitrary timing offset ($ATO_3$) between the first demodulated sequence and the third demodulated sequence; and
    determine a third differential TOA estimate ($TOA_{Diff_3}$) between the first sensor and the third sensor based on the first TOA estimate ($TOA_1$), the third TOA estimate ($TOA_3$), and the third arbitrary timing offset ($ATO_3$).

10. The system of claim 8, wherein the concentrator device is further configured to:
    determine a position estimate of the transmitting device based at least on the first differential TOA estimate ($TOA_{Diff_1}$), the second differential TOA estimate ($TOA_{Diff_2}$), and the third differential TOA estimate ($TOA_{Diff_3}$).

11. The system of claim 1, wherein transmitting the demodulated sequence and the TOA estimate to the concentrator device via the communication interface comprises:
    truncating the demodulated sequence to form a truncated demodulated sequence; and
    transmitting the truncated demodulated sequence to the concentrator device via the communication interface.

12. The system of claim 1, wherein the sensor of the plurality of sensors further comprises:
    a memory configured to store at least one of the emitter signal, the demodulated sequence of the emitter signal, or the TOA estimate of the emitter signal.

13. The system of claim 1, wherein determining the first arbitrary timing offset ($ATO_1$) between the first demodulated sequence and the second demodulated sequence comprises:
    adjusting an arbitrary phase offset of at least one of the first demodulated sequence and the second demodulated sequence.

14. The system of claim 1, wherein at least one of the first demodulated sequence, the first TOA estimate ($TOA_1$), the second demodulated sequence, the second TOA estimate ($TOA_2$) are received via a wireless communication network.

15. A method for determining a geographical position of a transmitting device, comprising:
- receiving, with a concentrator device, a first demodulated sequence from a first sensor, wherein the first demodulated sequence is generated based on an emitter signal received by the first sensor from the transmitting device;
- receiving, with the concentrator device, a first TOA estimate from the first sensor, wherein the first TOA estimate ($TOA_1$) is based on the emitter signal and the first demodulated sequence;
- receiving, with the concentrator device, a second demodulated sequence from a second sensor, wherein the second demodulated sequence is generated based on the emitter signal received by the second sensor from the transmitting device, the first sensor and the second sensor communicatively coupled to the concentrator device, wherein each of the first sensor and the second sensor includes a communication interface configured to receive the emitter signal from the transmitting device and a controller communicatively coupled to the communication interface;
- receiving, with the concentrator device, a second TOA estimate ($TOA_2$) from the second sensor, wherein the second TOA estimate ($TOA_1$) is based on the emitter signal and the second demodulated sequence;
- determining, by the concentrator device, a first arbitrary timing offset ($ATO_1$) between the first demodulated sequence and the second demodulated sequence;
- determining, by the concentrator device, a first differential TOA estimate ($TOA_{Diff_1}$) between the first sensor and the second sensor based on the first TOA estimate ($TOA_1$), the second TOA estimate ($TOA_2$), and the first arbitrary timing offset ($ATO_1$); and
- determining, by the concentrator device, a geographical position estimate of the transmitting device based at least on the first differential TOA estimate ($TOA_{Diff_1}$).

\* \* \* \* \*